May 5, 1959 A. I. SWARTZ 2,885,364

METHOD OF TREATING SEMICONDUCTING MATERIALS FOR ELECTRICAL DEVICES

Filed May 31, 1955 2 Sheets-Sheet 1

INVENTOR.
Allen I. Swartz
BY George W. Crowley
ATTORNEY

May 5, 1959
A. I. SWARTZ
METHOD OF TREATING SEMICONDUCTING MATERIALS
FOR ELECTRICAL DEVICES
2,885,364
Filed May 31, 1955
2 Sheets-Sheet 2

INVENTOR.
Allen I. Swartz
BY George W. Crowley
ATTORNEY

United States Patent Office 2,885,364

Patented May 5, 1959

2,885,364

METHOD OF TREATING SEMICONDUCTING MATERIALS FOR ELECTRICAL DEVICES

Allen I. Swartz, Malden, Mass., assignor to Columbia Broadcasting System, Inc., Danvers, Mass., a corporation of New York Application May 31, 1955, Serial No. 511,943

3 Claims. (Cl. 252—62.3)

Figure 1:
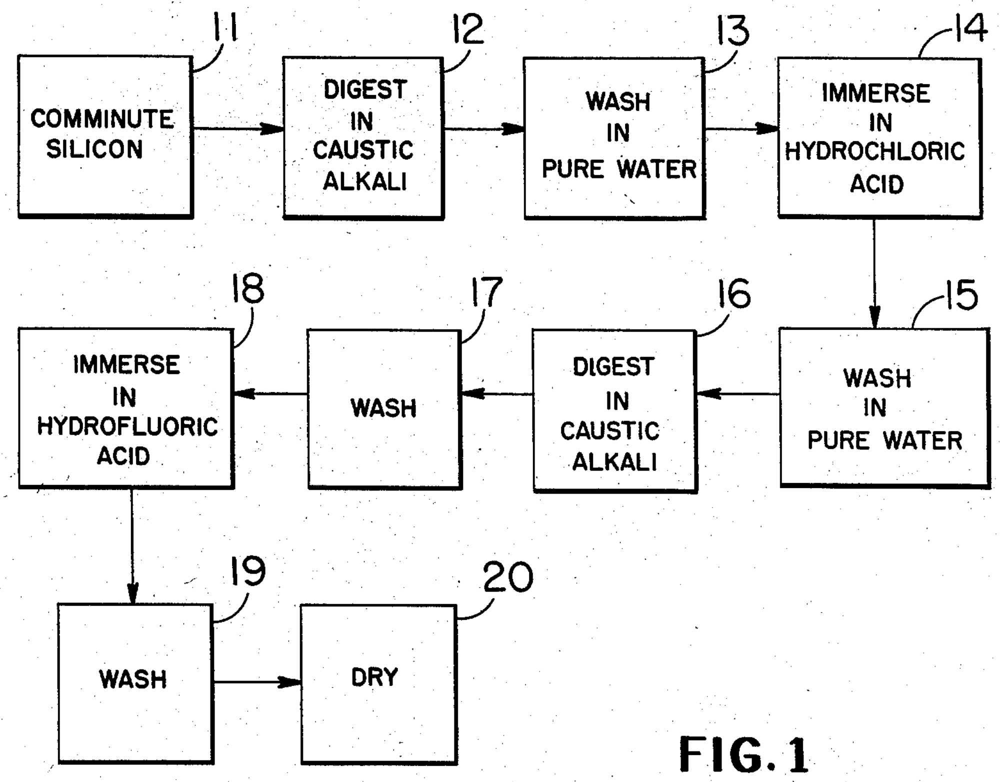
FIG. 1 PRIOR ART

This invention relates in general to semiconductor devices and in particular to the purification of the semiconducting material used in such devices.

The anomalous electrical characteristics of semiconducting materials have been common knowledge in the radio art for many years. However, rectifiers, thermistors, varistors and phototubes were among the best known circuit elements which utilized the peculiar characteristics of semiconducting materials until the development of the transistor.

Since the development of the transistor about six years ago, interest in semiconducting material has risen sharply. As a result of this quickened interest, the theory of operation of semiconducting materials has been explored intensely and new semiconductor devices have replaced thermionic tubes in many applications. An even more rapid rate of replacement of thermionic tubes by transistors is a much sought objective in the art, but several shortcomings in presently known techniques must be overcome before the desired objective may be attained.

A major reason barring presently known transistors from more widespread acceptance is the difficulty in obtaining semiconducting material which has the desired electrical characteristics. Although many materials possess directional electrical characteristics, very few may be utilized in semiconductor devices. The two most commonly used semiconducting materials are silicon and germanium.

Unfortunately, neither exists naturally in a pure enough state to be used in that state for semiconductor devices. Although a great deal of research in the art has been concentrated on the problem of refining silicon and germanium, the price of both remains high. Were it not for the fact that only a small amount of either silicon or germanium is needed in each transistor, transistors would still not be economically feasible.

Even more important than the material cost of the semiconducting material in each transistor is the difficulty presently encountered in making transistors which have electrical characteristics as consistent and reproducible as those of thermionic tubes. Experience has shown that one of the basic reasons for the greater dispersion in the characteristics of transistors is the presence of trace impurities in the semiconducting materials. The trace impurities are usually not evenly distributed through the semiconducting material. As a result, the electrical characteristics of the semiconducting material vary, depending on the exact concentration and position of such impurities. Present practice attempts to avoid variations in electrical characteristics in semiconducting material by removing substantially all unwanted trace impurities.

Trace impurities are usually removed from germanium in a two-step process. After first reducing germanium oxide with hydrogen in an inert atmosphere, an ingot of partially purified germanium is obtained. The ingot usually contains trace impurities of such elements as iron and copper in sufficient concentration to destroy the usefulness of the germanium as a semiconducting material.

The impurities are concentrated in the second step of the process by moving the ingot past a concentrated source of heat in an inert atmosphere to melt the ingot from one end to the other. The impurities migrate to the liquified portion of the ingot so that they become concentrated in the last part of the ingot to freeze. Both steps of the process must be carried out in controlled atmospheres to prevent undesirable reactions from occurring.

While such a two-step process removed practically all impurities, the resulting germanium is still not usable as the base material for a semiconductor device. The germanium is in a polycrystalline state, with almost every individual crystal perfect. The electrical bonds between the atoms which make up the lattice-like structure of the crystals in the germanium must be modified to allow conduction and the relatively random arrangement of the crystals must be made orderly.

Modification of the inter-atomic bonds may be accomplished in one of two ways, depending on the electrical characteristics desired. If a P-type semiconducting material is desired, an acceptor element from group III of the periodic table of the elements is dissolved in molten germanium. If an N-type is desired, a donor element from group V of the periodic table is used. Elements from other groups of the periodic table may, on occasion, be used, but group III and group V elements are most efficient. The solid solution of germanium and the selected electrical type-determining impurity are then ready to be formed into a single crystal. A previously prepared single crystal of germanium, the so-called seed, is brought into contact with the molten material. The crystal is slowly moved away from the melt. Portions of the melt become attached to the seed and solidify thereon. If the process is carefully carried out, a single large crystal results having the electrical type-determining impurity in exactly the correct proportions. This accomplishes modification of the crystal structure and elimination of any random arrangement of the crystals in one step.

The process of purifying silicon for use in semiconductor devices is quite similar to that used for germanium. The main difference between the two processes is that silicon tetrachloride is usually the raw material and zinc is the reducing agent rather than hydrogen. As a result of using zinc as the reducing agent, a P-type material is more likely to be obtained than an N-type since zinc is, under certain conditions, an acceptor.

In addition to germanium and silicon, many other materials exhibit the characteristics of semiconducting materials. Among such materials are cupric oxide and selenium, to mention only the most widely known. The nature of these other materials as well as germanium and silicon, is such that control of their electrical characteristics is dependent on complete control of the amount and type of impurities in the crystals of the materials.

Another step commonly taken in the fabrication of semiconductor devices is surface treatment of finished devices just before encapsulation. It is obvious that such treatment does not affect the basic characteristics of the material, but merely serves to remove any superficial blemishes which may have formed on the surface of the material during the manufacturing process.

Therefore, it is an object of this invention to simplify the process of refining semiconducting material for use in semiconductor devices.

It is another object of this invention to simplify the process of controlling the electrical characteristics of semiconducting materials.

It is still another object of this invention to reduce the cost of obtaining usable semiconducting material.

It is a further object of this invention to provide more uniform electrical characteristics of semiconducting materials.

It is a still further object of this invention to reduce the cost of semiconducting devices.

Figure 2:
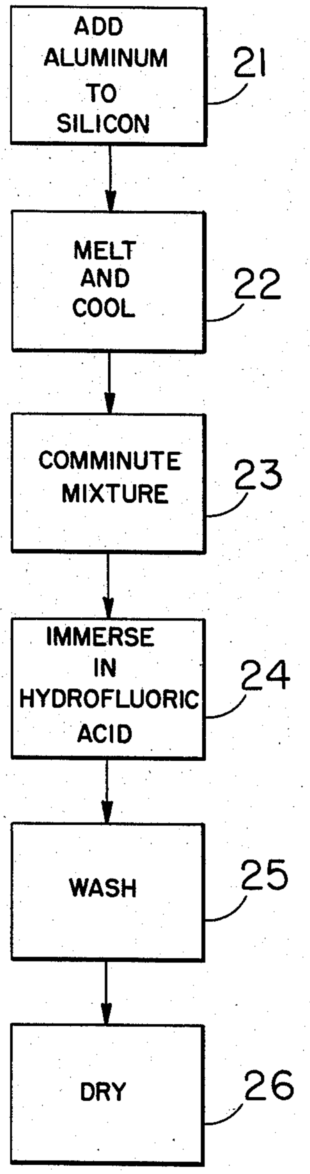

In general, this invention is concerned with a metal purifying process in which certain characteristics of metals are utilized to expedite and enhance purification in the following manner. All metals including germanium and silicon are ordinarily possessed of a definite grain structure with each grain, in turn, being composed of atoms bound together in a definite pattern by their orbital electrons. Any impurities in the material must be either distributed through the grains or disposed at the grain boundaries. Any impurities which are distributed through the grains of the material may be considered to be in solid solution while any impurities disposed at the grain boundaries may be considered to be mixed with the material. The concentration of impurities is invariably greater at the grain boundaries and crushing the material causes the more impure portions along the grain boundaries to be exposed. If the material is crushed so that the individual particles are approximately equal in size to the average grain size of the original material, substantially all the grain boundaries in the original material will be exposed. The tendency of the material to split along its grain boundaries may be increased and the electrical characteristics of the material may be modified by melting an excess of a particular electrical type-determining impurity with partially refined semiconducting material. Such a process modifies the grain structure by replacement therein of at least a portion of the atoms of any unwanted impurities with atoms of the electrical type-determining impurity. The unwanted impurities and the excess type-determining impurities are again concentrated at the grain boundaries when the material solidifies and may be exposed by crushing. After crushing, the comminuted material is subjected to the action of a solvent which dissolves the more impure material at the exposed grain boundaries more readily than the semiconductor material. After the unwanted impurities are dissolved, the solvent and dissolved impurities are decanted and the remaining material is neutralized. The neutralizer may also serve to remove certain unwanted impurities which are unaffected by the solvent. For a better understanding of the invention together with other objects, features and advantages, reference should be made to the following detailed explanation and drawings in which:

Fig. 1 is a block diagram showing the steps required to purify a semiconductor material according to a known process; and Fig. 2 is a block diagram showing the steps required to purify and adjust the electrical characteristics of a semiconductor material according to the present invention.

Referring now to Fig. 1, a process useful in the purification of silicon is shown although the generic process of the invention is equally applicable to germanium or other semiconductor material. An ingot of partially refined silicon is comminuted as indicated at block 11 so that a powder is formed. About 400 grams of the silicon powder are charged into a beaker, and an aqueous solution of a caustic alkali is added thereto as indicated at block 12. The concentration of the caustic alkali solution (which may be, for example, sodium or potassium hydroxide) can vary from 5 to 25% by weight without any significant difference in effect. A 10% solution of potassium hydroxide has been found to be satisfactory and is presently preferred. About 400 ml. of the solution is added to the silicon powder, and the powder is digested for about 15 minutes. The hydroxide solution is decanted to remove dissolved impurities and the remaining material is thoroughly washed as indicated at block 13 with distilled or demineralized water.

Following this washing, the silicon powder is treated with a halogen acid, as, for example, 1:1 hydrochloric acid as indicated at block 14. This reaction is continued for about 15 minutes and then the material is filtered and washed thoroughly as indicated at block 15. The treatment, first in alkali, then in acid may be repeated as indicated at blocks 16, 17 and 18 to ensure removal of substantially all the unwanted impurities. It is preferred, but not necessary, that hydrochloric acid be used for the first cycles and hydrofluoric acid be used for the last. If any residual acid remains, it will pass off as the volatile fluoride in subsequent treatments. After a final washing and drying as indicated at blocks 19 and 20, the silicon powder is ready for the crystal-growing process.

During the aforesaid comminuting process, the silicon breaks at its weakest points; i.e., along the grain boundaries. The material at the gain boundaries is an aggregate of all the materials present in the original ingot while each grain is a solid solution of silicon and the individual impurities. Since each grain is a solid solution, the proportion of impurity to silicon is fixed; but the material at the grain boundaries being an aggregate, the proportion of impurity to silicon there varies. In fact, the proportion of impurity to silicon is at least twice as great at the grain boundaries as that inside the grains.

The successive alkali-acid treatments are designed to dissolve the exposed aggregate of silicon and impurities more readily than the solid solution which makes up the grains. The exact sequence in which the alkali-acid treatments are carried out in the above process is a preferred rather than necessary condition. The two types of treatment are used merely to ensure removal of substantially all the aggregated impurities. Although the process may seem at first glance to be wasteful and repetitious, the art of analyzing the impurities contained in semiconductor devices is not yet advanced to the stage where quick and accurate analyses can be made except under elaborate laboratory conditions. Therefore, it is preferred to use two different solvents which, between them, dissolve away substantially all commonly encountered impurities in semiconductor material more rapidly than the semiconductor material itself.

Referring now to Fig. 2, a purifying process according to the invention is disgrammed. About 400 grams of partially purified silicon may be charged into a quartz crucible with about 20 grams of commercially pure aluminum as indicated at block 21. The mass is melted in a resistance-wound furnace in a protective argon atmosphere as indicated at block 22, and held at about 1450° C. for about 10 minutes to completely melt the mixture.

The molten mass is then allowed to solidify and cool in the form of a composite solid. The crucible, which reacts slightly with the molten silicon, sticks to the solidified mass and is removed by a chipping procedure.

The composite solid is comminuted in a porcelain mortar as indicated at block 23 so that the average particle size is about the average size of the grains in the mass. The crushed material is then treated with a hydrofluoric acid solution which may be 5 to 10% concentration as indicated at block 24 until substantially all of the impurities at the grain boundaries have been etched out. The action of the acid at this point is more marked with respect to the impurities than the silicon. Other re-agents which react quite readily with the impurities and only slightly or not at all with the silicon may be utilized with equal effect. The treated silicon is then washed thoroughly with demineralized water as indicated at block 25, dried, as indicated at block 26, and used to grow a single crystal.

Repetitive treatment with an acid and a caustic alkali is somewhat less important in this embodiment of the invention than in the process shown in Fig. 1. During the melting process, atoms of the electrical type-determining impurity replace substantially all the atoms of the other impurities to form, on cooling, a saturated solid solution of silicon and the particular electrical type-determining impurity. The excess of the electrical type-determining impurity and the other impurities migrate to the grain boundaries to form an aggregate there. As a result, the ratio of the concentration of impurities at the grain boundaries to the concentration of impurities in the grains themselves is even greater in this embodiment than in the process of Fig. 1. The caustic or acid solvent attacks the more impure aggregate even more readily in this embodiment so that cleanup is more easily accomplished.

It should be noted that aluminum is an element selected from group III of the periodic table. The semiconductor device resulting from the mixture of silicon and aluminum is P-type in which conduction by holes is experienced. Other well-known elements selected from group III of the periodic table would affect the electrical characteristics of the semiconductor device in the same way and would concentrate the unwanted impurities as efficiently.

If the electrical type-determining impurity were selected from the elements in group V of the periodic table, an N-type device would result. Electron conduction is experienced in such a type. An example of such a material is arsenic.

To obtain purified semiconducting material from which either type device may be made, other metallic elements may be used. For example, zinc is particularly well suited for purifying silicon without fixing its electrical characteristics. Traces of zinc are almost always present in partially purified silicon obtained by the reduction of silicon tetrachloride since zinc is the reducing agent in that process. Moreover, zinc has little effect on the electrical type characteristics of silicon. The purifying process may be carried out in exactly the same manner when zinc is used as that described in connection with Fig. 2 with aluminum except that the melting of zinc and silicon is preferably carried out under pressure to prevent vaporization of the zinc.

The unwanted impurities in the grain structure of the partially purified silicon are replaced to a large extent and migrate to the grain boundaries as explained heretofore in connection with the process using aluminum. Crushing and selective etching may then be utilized to purify the material. It is then a simple process to remove any remaining zinc by heat because the zinc tends to boil off at a relatively low temperature. Well-known methods of doping and forming the purified silicon may then be carried out to obtain either P-type or N-type silicon.

Although the invention has been illustrated and described in connection with a practical refining process in which it has been incorporated, it is believed that, amongst other things, the concepts of selectively dissolving impurities from the grain boundaries of a partially purified material and the substitution of a desired material for an unwanted material in a solid, have general application in the refining of other semiconducting materials.

Furthermore, minor variations of the process disclosed will suggest themselves to those skilled in the art. Such variations and modifications are believed to be within the spirit and scope of the present invention which should be limited only as necessitated by the appended claims.

What is claimed is:

1. The process of purifying partially refined silicon for use in a semiconductor device and simultaneously adjusting the electrical characteristics thereof which comprises the steps of adding approximately 5% aluminum, by weight, to said partially refined silicon, melting said aluminum and said silicon together in an inert atmosphere, cooling said silicon and said aluminum to form a composite solid having a first fraction of said aluminum in solution with said silicon and the remainder of said aluminum concentrated at the grain boundaries of said silicon and aggregated with impurities from said silicon, comminuting said composite solid to expose substantially every grain boundary thereof, and etching away the material adjacent said grain boundaries.

2. The process of removing undesired impurities from silicon and adjusting the electrical characteristics thereof comprising, the steps of adding a metallic element to said silicon, said metallic element being selected from the group of elements contained in group III and group V of the periodic table of the elements, melting said silicon and said metallic element together in an inert atmosphere, cooling said silicon and metallic element to form a composite mass, said composite mass having a first and second part, said first part being a substantially saturated solution of said metallic element in said silicon and having a crystalline structure, said second part being an aggregate of said metallic element and said undesired impurities concentrated at the grain boundaries of said crystalline structure, comminuting said composite mass to expose said second part, dissolving substantially all said second part of said composite mass, and washing and drying said first part of said composite mass.

3. The process of simultaneously purifying and adjusting the electrical characteristics of a base material of germanium for a semiconductor device which comprises the steps of adding an electrical type-determining impurity to said base material, said electrical type-determining impurity being selected from the metallic elements contained in group III and group V of the periodic table of the elements, the added amount of said impurity being in excess of the amount of said impurity that will go into solid solution in said base material and less than 5% by weight of said base material, melting said base material and impurity together in a neutral atmosphere, then cooling said base material and impurity to form a composite mass consisting of grains of said base material having said impurity in solution therein and an aggregate of said impurity and said base material concentrated at the boundaries of said grains, comminuting said base material and impurity to expose substantially all said aggregate, and selectively etching away substantially all said aggregate in preference to said base material.

References Cited in the file of this patent

UNITED STATES PATENTS

| | | |
|---|---|---|
| 2,402,839 | Ohl | June 25, 1946 |
| 2,419,561 | Jones | Apr. 29, 1947 |
| 2,588,008 | Jones et al. | Mar. 4, 1952 |